United States Patent
Mehta et al.

(10) Patent No.: US 11,226,252 B2
(45) Date of Patent: Jan. 18, 2022

(54) MULTILAYERED MAGNETIC FREE LAYER STRUCTURE IN MAGNETIC TUNNEL JUNCTION ARRAYS FOR SUB-MICROMETER RESOLUTION PRESSURE SENSORS

(71) Applicant: International Business Machines Corporation, Armonk, NY (US)

(72) Inventors: Virat Vasav Mehta, Menands, NY (US); Alexander Reznicek, Troy, NY (US); Chandrasekharan Kothandaraman, New York, NY (US); Eric Raymond Evarts, Niskayuna, NY (US); Pouya Hashemi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 629 days.

(21) Appl. No.: 16/241,543

(22) Filed: Jan. 7, 2019

(65) Prior Publication Data
US 2020/0217735 A1   Jul. 9, 2020

(51) Int. Cl.
G01L 9/16   (2006.01)
H01L 43/12  (2006.01)
H01L 43/02  (2006.01)
H01L 43/08  (2006.01)
H01L 43/10  (2006.01)

(52) U.S. Cl.
CPC .............. *G01L 9/16* (2013.01); *H01L 43/02* (2013.01); *H01L 43/08* (2013.01); *H01L 43/10* (2013.01); *H01L 43/12* (2013.01)

(58) Field of Classification Search
CPC . G01L 9/16; H01L 43/02; H01L 43/08; H01L 43/12; H01L 43/10
See application file for complete search history.

(56) References Cited

U.S. PATENT DOCUMENTS

| | | | |
|---|---|---|---|
| 7,059,201 B2 | 6/2006 | Prakash et al. | |
| 7,547,480 B2 | 6/2009 | Chung et al. | |
| 9,495,627 B1* | 11/2016 | Annunziata | ............. H01L 43/02 |
| 9,647,200 B1* | 5/2017 | Annunziata | ........... G11C 11/161 |
| 10,082,435 B2 | 9/2018 | Okamoto et al. | |

(Continued)

FOREIGN PATENT DOCUMENTS

DE   10250358 B4   2/2017

OTHER PUBLICATIONS

Loong, L. M., "Strain-enhanced tunneling magnetoresistance in MgO magnetic tunnel junctions", Scientific Reports, Published Sep. 30, 2014, 7 pages.

*Primary Examiner* — Jamel E Williams
(74) *Attorney, Agent, or Firm* — Scully, Scott, Murphy & Presser, P.C.; Daniel P. Morris, Esq.

(57) ABSTRACT

A sub-micrometer pressure sensor is provided that includes a multilayered magnetic tunnel junction (MTJ) pillar that contains a non-magnetic metallic spacer separating a first magnetic free layer from a second magnetic free layer. The presence of the non-magnetic metallic spacer in the multi-layered MTJ pillar improves the sensitivity without compromising area, and makes the pressure sensor binary (either "on" or "off") with little or no drift, and sensitivity change over time. Moreover, the resistivity switch in such a pressure sensor is instantly and a low error rate is observed.

20 Claims, 2 Drawing Sheets

(56) References Cited

U.S. PATENT DOCUMENTS

| | | |
|---|---|---|
| 10,468,585 B1* | 11/2019 | Nguyen ................ H01L 27/222 |
| 2014/0153139 A1 | 6/2014 | Takeo et al. |
| 2017/0016784 A1 | 1/2017 | Katti |
| 2018/0116535 A1 | 5/2018 | Fuji et al. |
| 2018/0156683 A1 | 6/2018 | Otsu et al. |
| 2018/0180686 A1* | 6/2018 | Ferreira .............. H01F 10/3254 |
| 2020/0158582 A1* | 5/2020 | Kothandaraman ..... G01L 1/125 |
| 2020/0217735 A1* | 7/2020 | Mehta ...................... G01L 9/16 |

* cited by examiner

MULTILAYERED MAGNETIC FREE LAYER STRUCTURE IN MAGNETIC TUNNEL JUNCTION ARRAYS FOR SUB-MICROMETER RESOLUTION PRESSURE SENSORS

BACKGROUND

The present application relates to a pressure sensor and a method of forming the same. More particularly, the present application relates to a sub-micrometer pressure sensor which includes a multilayered magnetic tunnel junction (MTJ) pillar that contains first and second magnetic free layers that are separated by a non-magnetic metallic spacer.

Current pressure sensors rely on large arrays of piezoelectric materials or magnetostrictive materials in dimension ranges of multiple micrometers to get a measurable electric response on sensed pressure. Piezoelectric based pressure sensors are less sensitive in terms of the magnitude of the pressure sensed and imprecise in specific location where pressure changes occur.

Pressure sensors containing a multilayered magnetic tunnel junction (MTJ) pillar that includes two ferromagnetic plates, each of which can hold a magnetization, separated by a thin dielectric layer (i.e., a tunnel barrier) are known. One of the two plates (i.e., the magnetic reference or pinned layer) is a permanent magnetic set to a particular polarity; the other plate's (i.e., the magnetic free layer's) magnetization can be changed to store information. MTJ pillar based pressure sensors are analog, with the magnetization of the magnetostrictive layers leading to a gradient response. Also, prior art pressure sensors containing such a MTJ pillar do not accurately sense the pressure, and have a high failure rate.

There is thus a need for providing a sub-micrometer, binary pressure sensor which is capable of precisely determining the magnitude of the pressure sensed and the specific location in which pressure changes occur, without experiencing drifting and with a low failure rate.

SUMMARY

A sub-micrometer pressure sensor is provided that includes a multilayered magnetic tunnel junction (MTJ) pillar that contains a non-magnetic metallic spacer separating a first magnetic free layer from a second magnetic free layer. The presence of the non-magnetic metallic spacer in the multilayered MTJ pillar improves the sensitivity without compromising area, and makes the pressure sensor binary (either "on" or "off") with little or no drift, and sensitivity change over time. Moreover, the resistivity switch in such a pressure sensor is instantly and a low error rate is observed.

In one aspect of the present application, a sub-micrometer, binary pressure sensor is provided that exhibits little or no drifting and has a low failure rate. In one embodiment, the pressure sensor includes a multilayered magnetic tunnel junction (MTJ) pillar located on a surface of a bottom electrode, wherein the multilayered MTJ pillar includes a first magnetic reference layer and a second magnetic reference layer that are separated by a non-magnetic metallic spacer. A top electrode is located on a topmost surface of the multilayered MTJ material pillar.

The multilayered MTJ pillar further includes a magnetic reference layer, a tunnel barrier layer, and a MTJ cap layer, wherein the tunnel barrier forms a first interface with the magnetic reference layer, and a second interface with the first magnetic free layer, and wherein the MTJ cap forms a first interface with the second magnetic reference layer and a second interface with the top electrode.

In another aspect of the present application, a method of forming a sub-micrometer, binary pressure sensor that exhibits little or no drifting and has a low failure rate is provided. In one embodiment, the method includes forming a first electrically conductive structure embedded in a first interconnect dielectric material layer, wherein a bottom electrode is located on a surface of the first electrically conductive structure. Next, a stack of a multilayered magnetic tunnel junction (MTJ) pillar and a top electrode is formed on a surface of the bottom electrode. In accordance with the present application, the multilayered MTJ pillar includes a first magnetic reference layer and a second magnetic reference layer that are separated by a non-magnetic metallic spacer. A second electrically conductive structure is formed in a second interconnect dielectric material layer that laterally surrounds the multilayered MTJ pillar and the top electrode. In accordance with the present application, the second electrically conductive structure contacts a surface of the top electrode.

DETAILED DESCRIPTION

Figure 1:
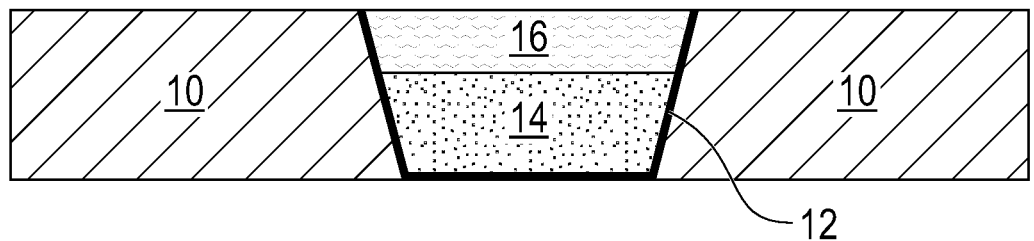
FIG. 1 is a cross sectional view of an exemplary structure that can be employed in the present application and including a bottom electrode located on a surface of a first electrically conductive structure that is embedded in a first interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in the present application in forming the sub-micrometer, binary pressure sensor of the present application. The exemplary structure of FIG. 1 includes a bottom electrode 16 located on a surface of a first electrically conductive structure 14 that is embedded in a first interconnect dielectric material layer 10.

It is noted that the drawings of the present application illustrate a device area in which a binary pressure sensor in accordance with the present application will be formed. A non-pressure sensor device area may be located laterally adjacent to the pressure sensor device area illustrated in the drawings of the present application. It is further noted that although the present application describes and illustrates a single bottom electrode 16 located on a single electrically conductive structure 14, the present application contemplates embodiments in which a plurality of electrically conductive structures are embedded in the first interconnect dielectric material layer 10, wherein a bottom electrode 16 is formed upon each of the electrically conductive structures 14 of the plurality of electrically conductive structures.

The first interconnect dielectric material layer 10 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first electrically conductive structure 14 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a diffusion barrier liner 12 is formed along the sidewalls and a bottom wall of the first electrically conductive structure 14. In some embodiments, no diffusion barrier liner is present. The diffusion barrier liner 12 is composed of a diffusion barrier material (i.e., a material that serves as a barrier to prevent a conductive material such as copper from diffusing there through). Examples of diffusion barrier materials that can be used in providing the diffusion barrier liner 12 include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level including the first interconnect dielectric material layer 10, the first electrically conductive structure 14, and, if present, diffusion barrier liner 12 may be formed utilizing conventional processes that are well-known to those skilled in the art. So as to not obscure the method of the present application, the techniques used to form the interconnect level including the first interconnect dielectric material layer 10, the first electrically conductive structure 14, and, if present, diffusion barrier liner 12 are not provided herein. It is noted that at least one other interconnect level and/or a middle-of-the-line (MOL) level may be located beneath the interconnect level including the first interconnect dielectric material layer 10, the first electrically conductive structure 14, and, if present, diffusion barrier liner 12. These other levels are not shown for clarity.

As is shown, the bottom electrode 16 is located on a surface of the first electrically conductive structure 14 that is embedded in the first interconnect dielectric material layer 10. In some embodiments and as is illustrated, the bottom electrode 16 is located on a recessed surface of the first electrically conductive structure 14. In such an embodiment, and prior to forming the bottom electrode 16, an upper portion of the first electrically conductive structure 14 is removed utilizing a recess etching process, and thereafter the bottom electrode 16 is formed upon the recessed surface of the first electrically conductive structure 14. In other embodiments (not shown), the bottom electrode 16 is formed on a non-recessed surface of the first electrically conductive structure 14. In such an embodiment, a dielectric capping layer (not shown) may be located laterally adjacent to the bottom electrode 16 and on a surface of the first interconnect dielectric material layer 10.

Bottom electrode 16, which is formed on a physically exposed surface of the first electrically conductive structure 14, may be composed of Ta, TaN, Ti, TiN, Ru, RuN, RuTa, RuTaN, Co, CoWP, CoN, W, WN or any combination thereof. The bottom electrode 16 may have a thickness from 2 nm to 25 nm; other thicknesses are possible and can be used in the present application as the thickness of the bottom electrode 16. The bottom electrode 16 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the conductive material that provides the bottom electrode 16.

In some embodiments (not shown), the bottom electrode 16 has a topmost surface that is coplanar with a topmost surface of a dielectric capping layer that may be present laterally adjacent to the bottom electrode 16 and on a topmost surface of the first interconnect dielectric material layer 10. In other embodiments and as is shown in FIG. 1, the bottom electrode 16 has a topmost surface that is coplanar with a topmost surface of the first interconnect dielectric material layer 10.

Figure 2:
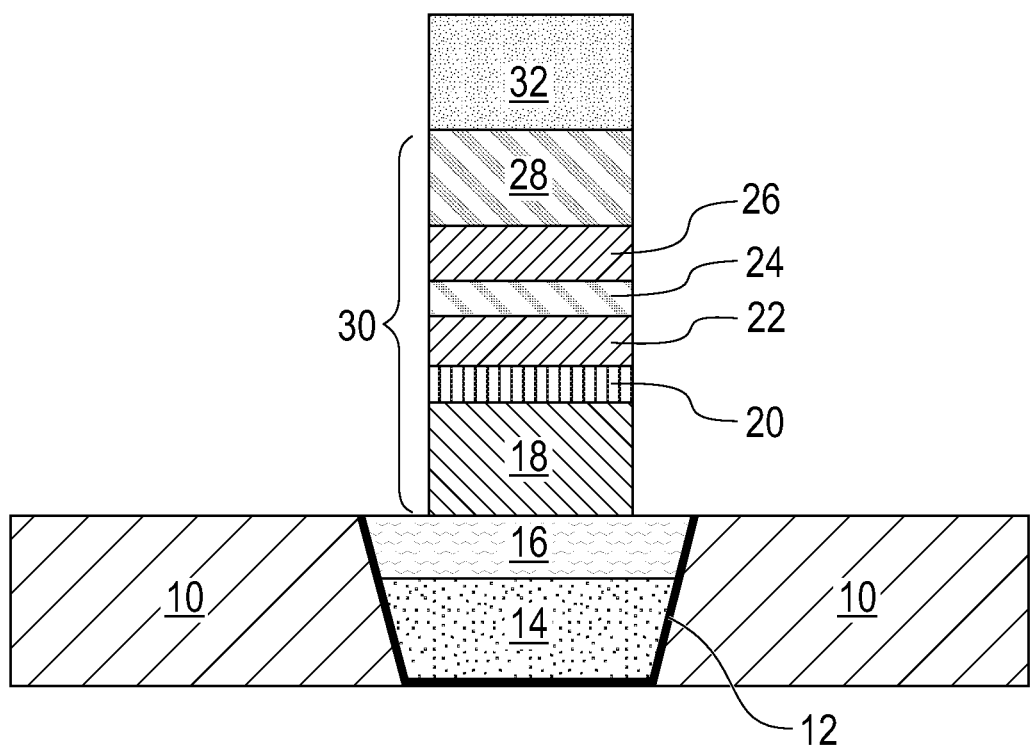
FIG. 2 is a cross sectional view of the exemplary structure of FIG. 1 after forming a multilayered magnetic tunnel junction (MTJ) pillar and a top electrode, wherein the multilayered MTJ pillar includes first and second magnetic free layers that are separated by a non-magnetic metallic spacer.

Referring now to FIG. 2, there is illustrated the exemplary structure of FIG. 1 after forming a multilayered magnetic tunnel junction (MTJ) pillar 30 and a top electrode 32, wherein the multilayered MTJ pillar 30 includes first and second magnetic free layers (22, 26) that are separated by a non-magnetic metallic spacer 24.

The multilayered MTJ pillar 30 and the top electrode 32 can be formed by first depositing blanket layers of various materials that provide the multilayered MTJ pillar 30 and the top electrode 32. The depositing of the blanket layers of various materials that provide the multilayered MTJ pillar 30 and the top electrode 32 can include chemical vapor deposition (CVD), plasma enhanced chemical vapor deposition (PECVD), atomic layer deposition (ALD), physical vapor deposition (PVD), sputtering, or plating. After depositing the various blanket layers of materials that provide the multilayered MTJ pillar 30 and the top electrode 32, a patterning process such as, for example, photolithography and etching, can be used to provide the exemplary stack of multilayered MTJ pillar 30 and top electrode 32 shown in FIG. 2.

The stack of the multilayered MTJ pillar 30 and top electrode 32 is typically cylindrical in shape and the stack may have a dimension from 25 nm to 100 nm; although other asymmetric shapes and dimensions for the stack of the multilayered MTJ pillar 30 and top electrode 32 are possible and are contemplated in the present application. The height of the multilayered MTJ pillar 30 and the top electrode 32 may be 50 nm or below. Other heights are possible and can be used for the height of the multilayered MTJ pillar 30 and the top electrode 32.

In the illustrated embodiment of FIG. 2, the multilayered MTJ pillar 30 may include a stack, of from bottom to top, a magnetic reference layer (that may include one or more magnetic reference materials) 18, a tunnel barrier layer 20, a first magnetic free layer (that may include one or more magnetic reference materials) 22, a non-magnetic metallic spacer 24, a second magnetic free layer (that may include one or more magnetic reference materials) 26, and a MTJ cap 28. Such a multilayered MTJ pillar 30 can be used as a component of a spin-transfer torque (STT) MRAM device. In STT MRAM, spin-transfer torque is used to flip (switch) the orientation of the magnetic free layer(s). Collectively, the first magnetic free layer 22, the non-magnetic metallic spacer 24, and the second magnetic free layer 26 may be referred to herein as multilayered magnetic free layer structure.

The magnetic reference layer 18 has a fixed magnetization. The magnetic reference layer 18 may be composed of a metal or metal alloy that includes one or more metals exhibiting high spin polarization. In alternative embodiments, exemplary metals for the formation of the magnetic reference layer include iron, nickel, cobalt, chromium, boron, or manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 20 is composed of an insulator material and is formed at such a thickness as to provide an appropriate tunneling resistance. Exemplary materials for the tunnel barrier layer 20 include magnesium oxide, aluminum oxide, and titanium oxide, or materials of higher electrical tunnel conductance, such as semiconductors or low-bandgap insulators.

The first magnetic free layer 22 may be composed of a magnetic material(s) with a magnetization that can be changed in orientation relative to the magnetization orientation of the magnetic reference layer 18. Exemplary materials for the first magnetic free layer 22 include alloys and/or multilayers of cobalt, iron, alloys of cobalt-iron, nickel, alloys of nickel-iron, and alloys of cobalt-iron-boron. The first magnetic free layer 22 has a first perpendicular magnetic anisotropy field, $H_k$. The magnetic anisotropy field, $H_k$, is the perpendicular field required to saturate a perpendicularly magnetized layer in the perpendicular-direction. In one embodiment, the first perpendicular magnetic anisotropy field of the first magnetic free layer 22 is from 100 Oe to 1000 Oe.

The non-magnetic metallic spacer 24 is composed of a non-magnetic metal or metal alloy that allows magnetic information to be transferred therethrough and also permits the two magnetic free layers (22 and 26) to couple together magnetically, so that in equilibrium the first and second magnetic free layers 22 and 26 are always parallel. The non-magnetic metallic spacer 24 allows for fast spin torque switching between the first and second magnetic free layers.

In one embodiment, the non-magnetic metallic spacer 24 may include a compressive elastic metal-containing material. The term "compressive elastic metal-containing material" is used throughout the present application to denote a metal or metal alloy whose deformation (i.e., strain) is large in response to a compressive elastic stress, i.e., a metal or metal alloy with a low Young's modulus, i.e., a Young's modulus of 120 Gigapascals (GPa) or less). In one embodiment, the compressive elastic metal-containing material has a Young's modulus from 20 GPa to 120 GPa. Illustrative examples of compressive elastic metal-containing materials that can be used in the present application as the non-magnetic metallic spacer 24 include, but are not limited to, aluminum (Al), titanium (Ti), zinc (Zn), magnesium (Mg) or alloys thereof.

In another embodiment, the non-magnetic metallic spacer 24 may include a RKKY metal. The term "RKKY metal" is used throughout the present application to denote a metal or metal alloy that permits a Ruderman-Kittel-Kasuya-Yosida (RKKY) coupling mechanism of the magnetic moments of the first and second magnetic free layers 22 and 26 by means of an interaction through conduction electrons. Illustrative examples of RKKY metals that can be used in the present application as the non-magnetic spacer 24 include, but are not limited to, chromium (Cr), ruthenium (Ru), rhodium (Rh), iridium (Ir), osmium (Os) or alloys thereof.

The non-magnetic metallic spacer 24 may have a thickness from 0.05 nm to 30 nm. Other thicknesses are possible and can be used in the present application as the thickness of the non-magnetic metallic spacer 24.

The second magnetic free layer 24 may include one of the magnetic materials mentioned above for the first magnetic free layer 22. In one embodiment, the second magnetic free layer 24 is composed of a same magnetic material as the first magnetic free layer 22. In another embodiment, the second magnetic free layer 24 is composed of a magnetic material that is compositionally different from the first magnetic free layer 22.

The second magnetic free layer 24 has a second perpendicular magnetic anisotropy field which is typically greater than the first perpendicular magnetic anisotropy field of the first magnetic free layer 22. In one embodiment, the second perpendicular magnetic anisotropy field of the second magnetic free layer 24 is from 1000 Oe to 2000 Oe.

The MTJ cap layer 28 can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer 28 may have a thickness from 2 nm to 25 nm; other thicknesses are possible and can be used in the present application as the thickness of the MTJ cap layer 28.

The top electrode 32 may be composed of one of the conductive materials mentioned above for the bottom electrode 16. The conductive material that provides the top electrode 32 is typically compositionally different from the MTJ cap layer 28. The top electrode 32 can have a thickness within the thickness range mentioned above for the bottom electrode 16. The top electrode 32 may be formed utilizing one of the deposition processes mentioned above in providing the bottom electrode 18.

Figure 3:
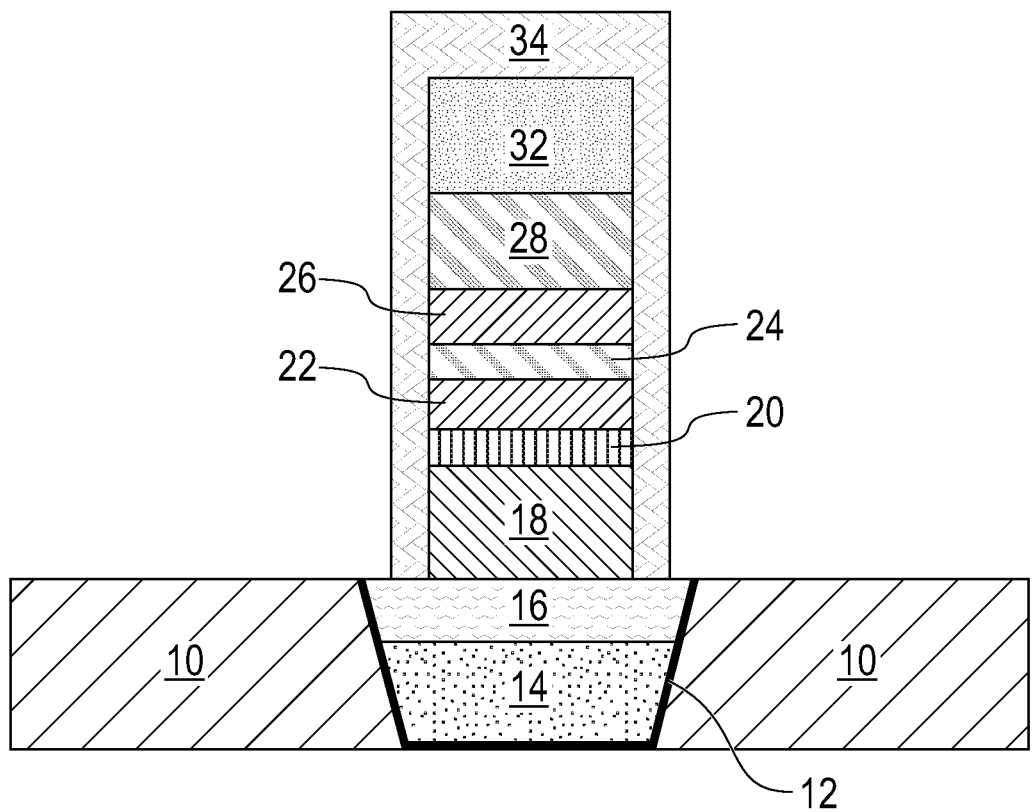
FIG. 3 is a cross sectional view of the exemplary structure of FIG. 2 after forming a passivation layer on physically exposed surfaces of the multilayered MTJ pillar and the top electrode.

Referring now to FIG. 3, there is illustrated the exemplary structure of FIG. 2 after forming a passivation layer 34 on physically exposed surfaces of the multilayered MTJ pillar 30 and the top electrode 32. In some embodiments (not shown), the passivation layer 34 may extend onto the physically exposed surfaces of the interconnect level including the first interconnect dielectric material layer 10 and the first electrically conductive structure 14.

The passivation layer 34 is composed of a dielectric material. In one embodiment, the passivation layer 34 is composed of silicon nitride. In another embodiment, the passivation layer 34 may be composed of a dielectric material that contains atoms of silicon, carbon and hydrogen. In some embodiments, and in addition to atoms of carbon and hydrogen, the dielectric material may include atoms of at least one of nitrogen and oxygen. In other embodiments, and in addition to atoms of silicon, nitrogen, carbon and hydrogen, the dielectric material may include atoms of boron. In one example, the passivation layer 34 may be composed of an nBLOK dielectric material that contains atoms of silicon, carbon, hydrogen, nitrogen and oxygen. In alternative example, the passivation layer 34 may be composed of a SiBCN dielectric material that contains atoms of silicon, boron, carbon, hydrogen, and nitrogen.

The passivation layer 34 can be formed utilizing a deposition process such as, for example, CVD, PECVD, PVD, or ALD. The passivation layer 34 may have a thickness from 10 nm to 200 nm. Other thicknesses are possible and can be employed as the thickness of the passivation layer 34.

Figure 4:
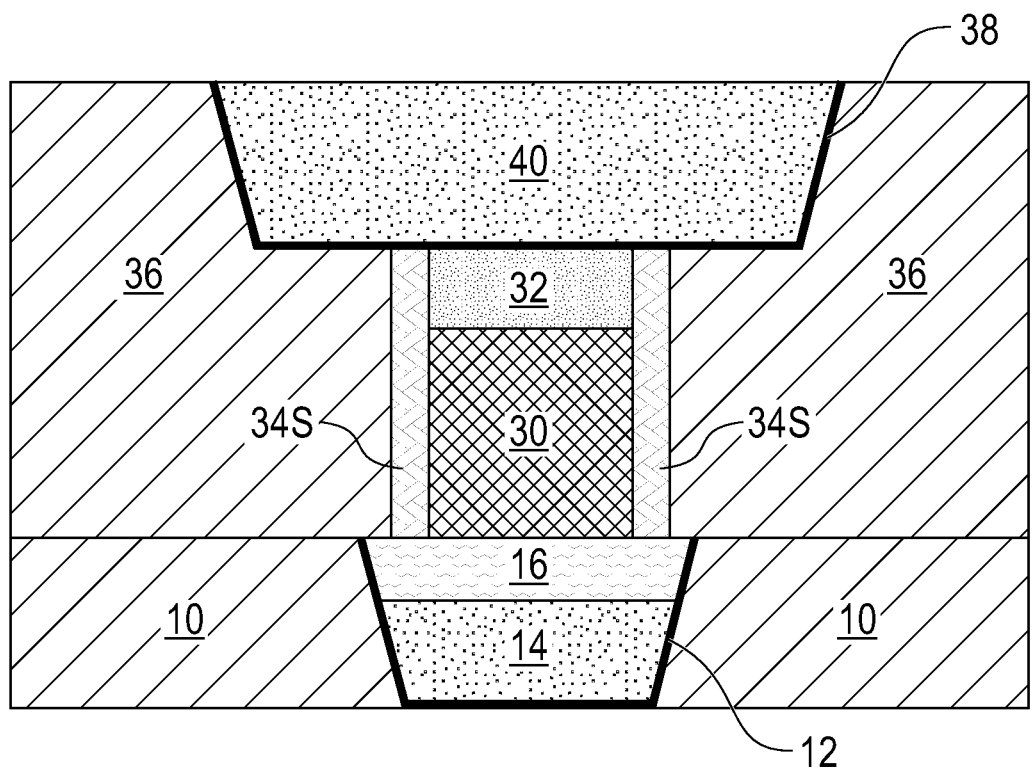
FIG. 4 is a cross sectional view of the exemplary structure of FIG. 3 after forming a second interconnect dielectric material layer surrounding the multilayered MTJ pillar and the top electrode, wherein the second interconnect dielectric material layer includes a second electrically conductive structure embedded therein and in contact with a surface of the top electrode.

Referring now to FIG. 4, there is illustrated the exemplary structure of FIG. 4 after forming a second interconnect dielectric material layer 36 surrounding the multilayered MTJ pillar 30 and the top electrode 32, wherein the second interconnect dielectric material layer 36 includes a second electrically conductive structure 40 embedded therein and in contact with a surface of the top electrode 32.

The second interconnect dielectric material layer 36 may include one of the dielectric materials mentioned above for the first interconnect dielectric material layer 10. In one embodiment, the second interconnect dielectric material layer 36 is composed of a same dielectric material as the first interconnect dielectric material layer 10. In another embodiment, the second interconnect dielectric material layer 36 is composed of a different dielectric material than the first interconnect dielectric material layer 10. The second interconnect dielectric material layer 34 may be formed by utilizing a conventional deposition process. In some embodiments, a dielectric capping layer (not shown) may be present between the first and second interconnect dielectric material layers (10, 36).

An opening is then formed into an upper portion of the second interconnect dielectric material layer 36 and the passivation layer 34 to physically expose a surface of top electrode 32. The opening can be formed by lithography and etching. During the etching, the passivation layer 34 that is present on the top electrode 32 is removed; passivation material remains on the sidewalls of the multilayer MTJ pillar 30 and the top electrode 32. The remaining passivation material may be referred to herein as a passivation spacer 34S. The passivation spacer 34S typically has a topmost surface that is coplanar with a topmost surface of the top electrode 32.

A diffusion barrier material liner 38 and a second electrically conductive structure 40 are then formed within the opening. The diffusion barrier material liner 38 and the second electrically conductive structure 40 can be formed by deposition of a diffusion barrier material layer and an electrically conductive metal or metal alloy layer, and then performing a planarization process to remove the diffusion barrier material layer and the electrically conductive metal or metal alloy layer that is present outside the opening and above the topmost surface of the second interconnect dielectric material layer 36. In some embodiments, the diffusion barrier material liner 38 is omitted.

The diffusion barrier material liner 38 may include one of the diffusion barrier materials mentioned above for diffusion barrier liner 12. In one embodiment, diffusion barrier material liner 38 is composed of a same diffusion barrier material as diffusion barrier liner 12. In another embodiment, diffusion barrier material liner 38 is composed of a different diffusion barrier material than diffusion barrier liner 12. A diffusion barrier material layer that provides the diffusion battier material liner 38 may be deposited utilizing a deposition.

The second electrically conductive structure 40 may include one of the electrically conductive metals or metal alloys mentioned above for the first electrically conductive structure 14. In one embodiment, the second electrically conductive structure 40 is composed of a same electrically conductive metal or metal alloy as the first electrically conductive structure 14. In another embodiment, the second electrically conductive structure 40 is composed of a different electrically conductive metal or metal alloy than the first electrically conductive structure 14. The electrically conductive metal or metal alloy that provides the second electrically conductive structure 40 may be deposited utilizing a conventional deposition process.

Notably, FIG. 4 illustrates a sub-micrometer, binary pressure sensor of the present application. The pressure sensor includes a multilayered MTJ pillar 30 that contains a magnetic reference layer 18, a tunnel barrier layer 20, a first magnetic free layer 22, a non-magnetic metal layer 24, a second magnetic free layer 26 and a MTJ cap layer 28 which is located on a surface of a bottom electrode 16. A top electrode 32 is located on a topmost surface of the multilayered MTJ pillar 30.

Although the sub-micrometer, binary pressure sensor shown in FIG. 4 includes a single multilayered MTJ pillar 30 located on a single bottom electrode 16, the sub-micrometer, binary pressure sensor of the present application may include a plurality of multilayered MTJ material pillars 30, wherein each pillar 30 is sandwiched between a bottom electrode 16 and a top electrode 32.

As pressure is applied to the non-magnetic metal layer 24 of the present application, the thickness and coupling of the first and second magnetic free layers 22, 26 changes. In detail, the magnetization orientation of the magnetic free layers relative to each other is changed. This change produces a change in the electrically resistance of the pressure sensor through the tunneling magnetoresistance effect. Notably, the pressure induces a change in coupling between the first and second magnetic free layers 22, 26 and at a critical pressure, coupling between the first and second magnetic free layers 22, 26 is strong and flips sign of the weaker magnetic free layer (typically the first magnetic free layer 22) to result in a binary change in resistance from pressure.

The advantage is that this change in resistance increases as the size of the pressure sensor decreases, contrary to existing technologies that lose signal as the device shrinks. As mentioned above, the pressure sensor of the present application is a binary switch (i.e., low vs. high resistance). Unique arrays with much smaller critical elements can be organized in differential sensing arrangements of the multilayered MTJ pillars of the present application with pressure sensing capability that can outperform current piezoelectric based pressure sensing arrays.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A sub-micrometer, binary pressure sensor comprising:
 a multilayered magnetic tunnel junction (MTJ) pillar located on a surface of a bottom electrode, wherein the multilayered MTJ pillar comprises a first magnetic reference layer and a second magnetic reference layer that are separated by a non-magnetic metallic spacer; and
 a top electrode located on a topmost surface of the multilayered MTJ material pillar.

2. The sub-micrometer, binary pressure sensor of claim 1, wherein the multilayered MTJ pillar further comprises a magnetic reference layer, a tunnel barrier layer, and a MTJ cap layer, wherein the tunnel barrier forms a first interface with the magnetic reference layer, and a second interface with the first magnetic free layer, and wherein the MTJ cap forms a first interface with the second magnetic reference layer and a second interface with the top electrode.

3. The sub-micrometer, binary pressure sensor of claim 1, wherein the first magnetic reference layer has a first perpendicular magnetic anisotropy field and the second magnetic reference layer has a second perpendicular magnetic anisotropy field which is greater than the first perpendicular magnetic anisotropy field.

4. The sub-micrometer, binary pressure sensor of claim 1, wherein the non-magnetic metallic spacer is a compressive elastic metal-containing material.

5. The sub-micrometer, binary pressure sensor of claim 4, wherein the compressive elastic metal-containing material comprises a metal or metal alloy having a Young's modulus of 120 GPa or less.

6. The sub-micrometer, binary pressure sensor of claim 1, wherein the non-magnetic metallic spacer is a RKKY metal.

7. The sub-micrometer, binary pressure sensor of claim 6, wherein the RKKY metal comprises Cr, Ru, Rh, Ir or Os.

8. The sub-micrometer, binary pressure sensor of claim 1, wherein the non-magnetic metallic spacer has a thickness from 0.05 nm to 30 nm.

9. The sub-micrometer, binary pressure sensor of claim 1, wherein the bottom electrode is located on a surface of a first electrically conductive structure that is embedded in a first interconnect dielectric material layer.

10. The sub-micrometer, binary meter pressure sensor of claim 9, further comprising a second interconnect dielectric material layer located above the first interconnect dielectric material layer and laterally surrounding the multilayered MTJ pillar and the top electrode, wherein a second electrically conductive structure is present in the second interconnect dielectric material layer that contacts a surface of the top electrode.

11. The sub-micrometer, binary pressure sensor of claim 9, wherein the bottom electrode has a topmost surface that is coplanar with a topmost surface of the first interconnect dielectric material layer.

12. The sub-micrometer, binary pressure sensor of claim 1, further comprising a passivation spacer located on a sidewall of the multilayered MTJ pillar and the top electrode.

13. A method of forming a sub-micrometer, binary pressure sensor, the method comprising:
 forming a first electrically conductive structure embedded in a first interconnect dielectric material layer, wherein a bottom electrode is located on a surface of the first electrically conductive structure;
 forming a stack of a multilayered magnetic tunnel junction (MTJ) pillar and a top electrode on a surface of the bottom electrode, wherein the multilayered MTJ pillar comprises a first magnetic reference layer and a second magnetic reference layer that are separated by a non-magnetic metallic spacer; and
 forming a second electrically conductive structure in a second interconnect dielectric material layer that laterally surrounds the multilayered MTJ pillar and the top electrode, wherein the second electrically conductive structure contacts a surface of the top electrode.

14. The method of claim 13, wherein the multilayered MTJ pillar further comprises a magnetic reference layer, a tunnel barrier layer, and a MTJ cap layer, wherein the tunnel barrier forms a first interface with the magnetic reference layer, and a second interface with the first magnetic free layer, and wherein the MTJ cap forms a first interface with the second magnetic reference layer and a second interface with the top electrode.

15. The method of claim 13, wherein the non-magnetic metallic spacer is a compressive elastic metal.

16. The method of claim 15, wherein the compressive elastic metal-containing material comprises a metal or metal alloy having a Young's modulus of 120 GPa or less.

17. The method of claim 13, wherein the non-magnetic metallic spacer is a RKKY metal.

18. The method of claim 17, wherein the RKKY metal comprises Cr, Ru, Rh, Ir or Os.

19. The method of claim 13, further comprising forming, prior to the forming of the second electrically conductive structure, a passivation layer on physically exposed surfaces of the multilayered MTJ pillar and the top electrode, and wherein during the forming of the passivation layer a portion of the passivation layer located above the top electrode is removed.

20. The method of claim 13, wherein the first magnetic reference layer has a first perpendicular magnetic anisotropy field and the second magnetic reference layer has a second perpendicular magnetic anisotropy field which is greater than the first perpendicular magnetic anisotropy field.

* * * * *